United States Patent [19]

Kita

[11] 4,115,128

[45] Sep. 19, 1978

[54] POSITIVE IMAGE FORMING RADIATION SENSITIVE COMPOSITIONS CONTAINING DIAZIDE COMPOUND AND ORGANIC CYCLIC ANHYDRIDE

[75] Inventor: Nobuyuki Kita, Shizuoka, Japan

[73] Assignee: Fuji Photo Film Co., Ltd., Minami-ashigara, Japan

[21] Appl. No.: 751,875

[22] Filed: Dec. 17, 1976

[30] Foreign Application Priority Data

Dec. 26, 1975 [JP] Japan .................................. 51-156662

[51] Int. Cl.² ............................................. G03C 1/60
[52] U.S. Cl. .................................... 96/91 D; 96/35.1; 96/115 R

[58] Field of Search .................. 96/91 D, 91 R, 91 N, 96/35.1, 115 R

[56] References Cited

FOREIGN PATENT DOCUMENTS 1,492,442 8/1967 France.

Primary Examiner—John D. Welsh
Attorney, Agent, or Firm—Sughrue, Rothwell, Mion, Zinn & Macpeak

[57] ABSTRACT

A radiation-sensitive composition capable of producing a positive image upon exposure to actinic radiation and subsequent treatment with a basic solution which comprises (a) an o-naphthoquinone diazide compound, (b) an alkali soluble film-forming phenolic resin and (c) an organic acid cyclic anhydride.

6 Claims, No Drawings

POSITIVE IMAGE FORMING RADIATION SENSITIVE COMPOSITIONS CONTAINING DIAZIDE COMPOUND AND ORGANIC CYCLIC ANHYDRIDE

BACK GROUND OF THE INVENTION

1. Field of the Invention

This invention relates to a radiation-sensitive composition suitable for the manufacture of lithographic printing plates, color proofs for multicolor printing, drawings for overhead projectors, IC circuits, photomasks, etc., and more particularly a radiation-sensitive composition which is provided with an improved photographic speed by the incorporation of an organic acid cyclic anhydride to a radiation-sensitive composition comprising an o-naphthoquinone diazide and a phenolic resin.

2. Description of the Prior Art

Radiation-sensitive compositions capable of producing a positive image upon exposure to actinic radiation and subsequent treatment with a basic solution which comprise an o-naphthoquinone diazide and an alkali soluble film forming phenolic (hereinafter phenolic resin) resin have long been known to be extremely suitable for the manufacture of lithographic printing plates and photo-resists an industrial scale. Various attempts have been made, without remarkable success, to improve the photographic speed of such radiation-sensitive compositions comprising an o-naphthoquinone diazide compound and an alkali soluble film forming phenolic resin. For example, a reduction of the amount of the o-naphthoquinone diazide compound reasonably increases the speed, however, such an improvement is offset by a reduced latitude as to development conditions, which is a serious drawback from a practical view point. The speed of radiation-sensitive compositions comprising an o-naphtho-quinone diazide and a phenolic resin can also be increased, as is described in U.S. Pat. No. 3,661,582 (corresponding to Japanese Patent Publication No. 12242/1973), by incorporating more than 0.5% by weight of an additive selected from the group consisting of an aromatic or pseudo-aromatic compound containing a hetero nucleus which involves more than two nitrogen atoms in the nucleus ring structure, at least, one of the nitrogen atoms being bonded to a hydrogen atom, and which does not involve any other hetero atoms, 2-azacyclononane-2-ones, indoles, quinazolines, and tetrazoles, but again such systems suffer from an extremely narrow development latitude similar to the case described above in which a reduced amount of o-naphthoquinone diazide is used. Further Japanese Patent Publication No. 42449/1971 described various additives including triphenylmethane cyanine dyes, benzaldehyde-m-tolylhydrazine, halogenated hydrocarbons, azo dyes, etc. to increase the photographic speed; however, none of these is remarkably effective.

SUMMARY OF THE INVENTION

Accordingly, an object of the present invention is to provide a radiation sensitive composition comprising an o-naphthoquinone diazide compound and a film forming phenolic resin whose photographic speed is improved by the incorporation therein of a third component.

Another object of the present invention is to provide a high speed radiation sensitive composition whose photographic speed is improved without giving rise to any adverse effect on developing latitude.

It has now been found as a result of extensive research and investigation that the above-cited objects can be achieved by adding an organic acid cyclic anhydride to a radiation sensitive composition comprising an o-naphthoquinone diazide compound and a phenolic resin.

Accordingly, this invention provides a radiation sensitive composition capable of producing a positive image upon exposure to actinic radiation and subsequent treatment with a basic solution which comprises (a) an o-naphthoquinone diazide compound, (b) an alkali soluble film forming phenolic resin and (c) an organic acid cyclic anhydride.

DETAILED DESCRIPTION OF THE INVENTION

O-Naphthoquinone diazide compounds particularly suitable for the present invention include esters of halides of naphthoquinone-(1,2)-diazide-(2)-sulfonic acids and phenolic compounds such as a pyrogallol-acetone resin which are described in U.S. Pat. No. 3,635,709 (corresponding to Japanese Patent Publication No. 28403/1968). Other suitable o-naphthoquinone diazide compounds are esters of halides o-naphthoquinone-(1,2)-diazide-(2)-sulfonic acid and a phenol-formaldehyde resin, such as those disclosed in U.S. Pat. Nos. 3,046,120 and 3,188,210. Still other useful o-naphthoquinone diazide compounds are those disclosed in U.S. Pat. No. 3,644,118, Japanese Patent Application (OPI) Nos. 63803/1973; 63802/1973; 96575/1973; 38701/1974; U.S. Pat. No. 3,823,130, Japanese Patent Publication Nos. 11222/1966; 9610/1970; and 17481/1974; U.S. Pat. Nos. 2,797,213; 3,454,400; 3,544,323; 3,573,917; 3,674,495 and 3,785,825; British Pat. Nos. 1,227,602; 1,329,888 and 1,330,932, German Pat. No. 854,890, U.S. Pat. Nos. 3,759,711 and 3,837,860.

Particularly preferred examples of o-naphthoquinone diazides which can be used in this invention are those represented by the following general formula (I)

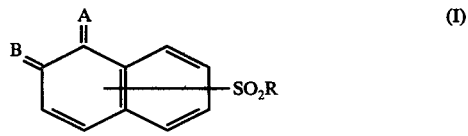

(I)

wherein A represents $N_2$ or O and B is O when A is $N_2$ or B is $N_2$ when A is O, and R represents a residue having a hydroxy group or an amino group.

Alkali soluble film forming phenolic resins which can be used in the present invention have a molecular weight of from about 300 to about 100,000, preferably from 300 to 10,000. These phenolic resins are not radiation-sensitive and are prepared by the condensation of phenol with formaldehyde or by the polymerization of hydroxystyrenes. More generally, the reaction of phenolic compounds with formaldehyde is the reaction of a phenolic compound having two or three reactive aromatic ring hydrogen positions with an aldehyde or aldehyde precursor compound capable of undergoing a phenol-aldehyde condensation. Illustrative examples of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl)propane and the like.

Illustrative examples of especially effective aldehydes are formaldehyde, acetaldehyde, acrolein, crotonaldehyde, furfural, and the like. Illustrative example of aldehyde precursor compounds are 1,3,5-trioxane, etc. Ketones such as acetone are also capable of condensing with the phenolic compounds. Particularly useful alkali soluble film forming phenolic resins are phenol/formaldehyde novolac resins, cresol/formaldehyde novolac resins, p-tert-butylphenol/formaldehyde novolac resins, phenol-modified xylene/formaldehyde resins, polyhydroxy styrenes and polybromohydroxystyrene. Cresol/formaldehyde novolac resins are especially preferred for use in this invention.

The o-naphthoquinone diazide compound is employed at from about 10 to about 50% by weight and more preferably from 20 40% by weight of the total weight of the radiation sensitive composition. The amount of the phenolic resin employed ranges from about 45 to about 79% by weight, and more preferably from 50 to 70% by weight of the total radiation sensitive composition, For the purposes of illustration and not limitation suitable organic acid cyclic anhydrides can be represented by the following formulae (II) or (III)

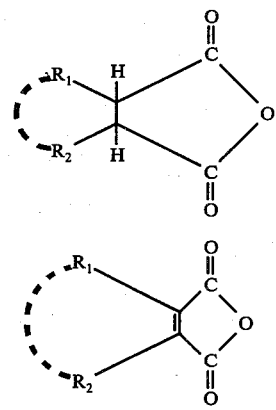

wherein $R_1$ and $R_2$ each represents a hydrogen atom, a halogen atom, an unsubstituted or substituted alkyl group and an unsubstituted or substituted aryl group, and $R_1$ and $R_2$ may combine together to form a cyclic ring which includes a cycloalkyl group, a halo(cycloalkyl)group, a cycloalkylene group, an aryl group, and further a heterocyclic group.

Organic acid cyclic anhydrides employed in the radiation sensitive compositions comprising an o-naphthoquinone diazide and a phenolic resin in the present invention include, for example, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, pyromellitic anhydride, etc. Preferably these organic acid cyclic anhydrides are used in an amount of between about 1 and about 15%, and more preferably between 4 and 8%, by weight, again based on the total rediation-sensitive composition weight. Within these ranges the organic acid cyclic anhydride can increase the photographic speed by a factor of upto about three without causing practically any additional problems as to development latitude. For an amount below about 1% by weight, the advantageous effects of the acid cyclic anhydride are not observed while above about 15% by weight the development latitude is affected adversely to a marked degree A filler, a dye or a pigment can also be incorporated into the composition of the present invention. Use of a filler can not only improve the physical properties of the coated film, but also prevents image blurring by improving the contact between the original and the radiation sensitive layer during exposure in a vacuum plate due to the surface roughening resulting. Suitable fillers include talc powder, glass powder, clay, starch, wheat flour, corn powder, Teflon powder, etc. Dye and pigments are important in coloring of the resulting image. These additives can be in general employed in an amount ranging from about 0.5 to about 20% by weight based on the total weight of the radiation sensitive composition.

Selection of the kind and the amount of the dye or the pigment employed in the radiation sensitive composition are particularly important. Oil soluble and basic dyes are especially suited for the present purposes, including Oil Yellow #101, Oil Yellow #130, Oil Pink #312, Oil Green BG, Oil Blue BOS, Oil Blue #603, Oil Black BY, Oil Black BS, Oil Black T-505, (all of which are the products of Orient Chemical Industrial Co., Ltd.) crystal violet, rhodamine B, Malachite green, methylene blue, etc.

A composition prepared in accordance with the present invention is coated on a suitable substrate after such is dissolved in a solvent which can dissolve or disperse the above described components. Suitable solvents used for coating include ethylene dichloride cyclohexanone, methyl ethyl ketone, ethylene glycol monomethyl ether, methyl Cellosolve acetate, toluene, ethyl acetate, etc. These solvents can be used individually or as mixtures thereof. Usually the amount of non-volatile components (solid components) ranges from about 2 to about 50% by weight. A suitable range of coating weight on a dry basis is from about 0.5 to about 3.0 g/m². Lower coating amounts favor the photographic speed, although such are accompanied by a reduction in film strength.

Suitable substrates for the production of lithographic printing plates using the radiation sensitive compositions of the present invention include an aluminum sheet whose surface has been treated to render it hydrophilic, such as silicate treated, anodized, grained, and electrolytically silicate deposited aluminum sheets. A zinc plate, a stainless steel plate, a chromated steel plate, a synthetic resin film or a paper the surface of which have been rendered hydrophilic, etc. can be used. More specifically suitable surface treatment techniques which can be used include a silicate treatment as described in U.S. Pat. No. 2,714,066, a potassium fluorozirconate treatment as described in U.S. Pat. No. 2,946,683, a phosphomolybdate treatment as described in U.S. Pat. No. 3,201,247, a silicate electro-deposition treatment as described in U.S. Pat. No. 3,658,662, and a silicate plus anodic oxidation treatment as described in U.S. Pat. No. 3,181,461, etc. Substrates suitable for the production of proofs for printing, overhead projection films, and transparencies for contact printing include transparent synthetic resin films of polyethylene terephthalate, cellulose triacetate, etc. and films whose surface have been roughened chemically or physically. Suitable substrates for the production of photomasks include a polyethylene terephthalate film on the surface of which is vacuum deposited aluminum alloys or chromium and a polyethylene terephthalate film provided with a colored layer. For the purpose of photo-resist preparation, the radiation-sensitive composition of the present invention can be coated on various substrates other than those cited above (e.g., aluminum iron, stainless steel, copper, glass, plastics (polyethylene, polyethylen-terephthalate), etc.).

Suitable developing solutions for the radiation sensitive composition of the present invention are aqueous solutions of inorganic alkaline compounds such as those of sodium silicate, potassium silicate, sodium hydroxide, potassium hydroxide, lithium hydroxide, sodium phosphate, sodium monohydrogen phosphate, ammonium phosphate, ammonium monohydrogen phosphate, sodium metasilicate, sodium bicarbonate, ammonia, etc., with a suitable concentration of these compounds being between about 0.1 and about 10, more preferably between 0.5 and 5%, by weight. Specific examples of developer solutions are disclosed in U.S. Pat. Nos. 3,110,596, 3,173,788, 3,586,504, etc.

Such an alkaline solution can also contain certain organic solvents such as alcohols (e.g., methanol, ethanol, benzyl alcohol, etc.) as well as a surface active agent (e.g., sodium alkylnaphthalene sulfonate, sodium lauryl sulfate, etc.) depending on the requirements.

The present invention is explained in greater detail by referrence to some specific examples thereof. However, the invention should not be construed as being limited to these examples. Unless otherwise indicated, all percents, parts, ratios and the like are by weight.

EXAMPLE 1

A sheet of 2S aluminum with a thickness of 0.15 mm was degreased by immersion in a 10% aqueous solution of sodium phosphate maintained at 80° C for 3 min., then grained with a nylon brush, and subjected to de-smut treatment in a 3% sodium hydrogen sulfate aqueous solution. Aluminum substrate (1) was prepared by treating the thus conditioned aluminum sheet with a 1.5% sodium silicate aqueous solution at 70° C for 1 min. A radiation sensitive coating solution of the following composition was applied onto this substrate (1) and then the sheet was dried for 2 min. at 100° C.

| | |
|---|---|
| Esterified Product of Naphthoquinone-(1,2)-diazide-(2)-, 5-sulfonyl Chloride with a pyrogallolacetone condensation resin (the product described in the first example of U.S. Pat. No. 3,635,709) | 0.30 g |
| Cresol/Formaldehyde Novalac Resin (weight average molecular weight: about 1400, by gel permeation chromatography) | 0.97 g |
| Tetrahydrophthalic Anhydride | (See Table I) |
| Addition Product between Benzyl Alcohol and Colonate L* | 0.03 g |
| Oil Blue #603** | 0.01 g |
| Ethylene Dichloride | 10 g |
| 2-Methoxyethyl Acetate | 10 g |

*A product of Nippon Polyurethane Industries, Ltd.; a polyisocyanate compound obtained by reacting 3 mols of toluene di-isocyanate and 1 mol of trimethylolpropane.
**A product of Orient Chemical Industrial Co., Ltd.

The coating weight was 1.2–1.3 g/m² on a dry basis. The photosensitive lithographic plates thus prepared were exposed to light using a 30 A carbon arc light source with a distance of 70 cm, developed with an alkali aqueous solution (DP-1, a commercial product of Fuji Photo Film Co., Ltd.) which had been diluted to 1:10 by volume at 25° C for 60 sec., and then subjected to a measurement of the sensitivity. The optimum exposure time was defined as the value at which 7 steps of a gray scale with a density difference of 0.15 were perfectly clear. The development latitude was defined as the time within which one step difference took place in clearing on a gray scale with a density difference of 0.15 for the DP-1 developer diluted 10 times at 25° C.

Table 1 shows the change in photographic speed and development latitude with the content of tetrahydrophthalic anhydride.

Table 1

| Amount of Tetrahydrophthalic Anhydride Added versus Speed and Development Latitude | | |
|---|---|---|
| Content of Tetrahydrophthalic Anhydride | Speed Expressed by Optimum Exposure Time | Development Latitude |
| (g) | (sec) | (min.) |
| 0 (Reference) | 120 | less than 5 |
| 0.05 | 80 | " |
| 0.075 | 50 | " |
| 0.10 | 40 | " |
| 0.125 | 35 | " |

The results show that an increase of photographic speed of 3 times has been realized without any accompanying adverse effect on development latitude.

EXAMPLE 2

The photosensitive plate preparation and measurement procedures described in Example 1 were repeated following exactly the same procedures except that the tetrahydrophthalic anhydride was replaced by, in turn, 0.10 g of each of maleic anhydride, succinic anhydride or phthalic anhydride. The optimum exposure time values determined were 80 sec. for maleic anhydride, 60 sec. for succinic anhydride, and 80 sec. for phthalic anhydride, respectively.

EXAMPLE 3

A 0.24 mm thick 2S aluminum plate was degreased by immersion in an aqueous 10% sodium phosphate solution maintained at 80° C for 3 min., grained with a nylon brush, and then etched using sodium aluminate for about 10 sec. The etched plate was then subjected to a de-smut treatment with an aqueous 3% sodium hydrogen sulfate solution. Then the plate was anodized in a 20% sulfuric acid aqueous solution with a current density of 2 A/dm² for 2 min. to give Aluminum Plate (II).

The following coating solution was coated on this Aluminum Plate (II), and drying was carried out at 100° C for 2 min.

| Coating Solution | |
|---|---|
| Esterified Product of Naphthoquinone (1,2)-diazide-(2)-5-sulfonyl Chloride with Pyrogallol-acetone Resin (as described in Example 1) | 0.50 g |
| Cresol/Formaldehyde Novolac Resin (as described in Example 1) | 1.00 g |
| Tetrahydrophthalic Anhydride | 0.125 g |
| Oil Blue #603 (a product of Orient Chemical Industrial Co., Ltd.) | 0.01 g |
| Ethylene Dichloride | 10 g |
| 2-Methoxyethyl Acetate | 10 g |

The coating weight after drying was 1.20 g/m². The optimum exposure time and development latitude of this photosensitive lithographic plate were measured as in Example 1 and values of 120 sec. and of 10 min. or less, respectively, were obtained. For the purpose of comparison, a reference sample was prepared excluding tetrahydrophthalic anhydride from the coating composition, and the values of 160 sec. and of 10 min. or less, respectively were obtained. Thus, the addition of tetrahydrophthalic anhydride resulted in a speed increase of

What is claimed is:

1. A radiation-sensitive composition capable of producing a positive image upon exposure to actinic radiation and subsequent treatment with a basic solution which consists essentially of, by weight based on weight of the total composition, (a) 10 to 50 weight percent of an o-naphthoquinone diazide compound, (b) 45 to 79 weight percent of an alkali soluble film-forming phenolic resin and (c) 1 to 15 weight percent of an organic acid cyclic anhydride represented by the following formulae (II) or (III)

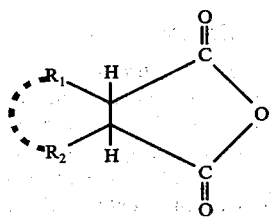 (II)

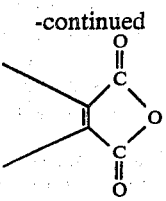 (III)

wherein $R_1$ and $R_2$ each represents a hydrogen atom, a halogen atom, an unsubstituted or substituted alkyl group, or an unsubstituted or substituted aryl group, and $R_1$ and $R_2$ may combine together to form a cyclic ring.

2. The composition of claim 1, wherein said o-naphthoquinone diazide compound is an ester of a halide of naphthoquinone(1,2)-diazide-(2)-sulfonic acid and a phenolic compound.

3. The composition of claim 1, wherein said o-naphthoquinone diazide compound is an ester of a halide of naphthoquinone-(1,2)-diazide-(2)-sulfonic acid and a pyrogallol-acetone condensation resin, a phenolformaldehyde novolac resin or a poly(hydroxy styrene).

4. The composition of claim 1, wherein said phenolic resin is a phenol/formaldehyde novolac resin, a cresol/-formaldehyde novaolac resin, a p-tert-butyl phenol/formaldehyde novolac resin, a phenolmodified xylene/formaldehyde resin, a poly(hydroxystyrene) or a poly(-bromohydroxystyrene).

5. The composition of claim 1, wherein said organic acid cyclic anhydride is phthalic acid anhydride, tetrachlorophthalic acid anhydride, tetrahydrophthalic acid anhydride, hexahydrophthalic acid anhydride, 3,6-endoxy-$\Delta^4$-tetrahydrophthalic acid anhydride, maleic acid anhydride, $\alpha$-chloromaleic acid anhydride, $\alpha$-phenylmaleic acid anhydride, succinic acid anhydride or pyromellitic acid anhydride.

6. The composition of claim 1 wherein said cyclic ring is a cycloalkyl group, a halo (cycloalkyl) group, a cycloalkylene group, an aryl group, or a heterocyclic group.

* * * * *